United States Patent
Uchida et al.

(10) Patent No.: US 6,476,689 B1
(45) Date of Patent: Nov. 5, 2002

(54) LC FILTER WITH CAPACITOR ELECTRODE PLATE NOT INTERFERING WITH FLUX OF TWO COILS

(75) Inventors: Katsuyuki Uchida, Hikone; Masami Sugitani, Omihachiman, both of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/666,938

(22) Filed: Sep. 21, 2000

(30) Foreign Application Priority Data

Sep. 21, 1999 (JP) .......................................... 11-266728

(51) Int. Cl.⁷ ................................................ H03H 7/09
(52) U.S. Cl. ...................................... 333/177; 333/185
(58) Field of Search ................................. 333/177, 175, 333/185; 361/270

(56) References Cited

U.S. PATENT DOCUMENTS 4,342,143 A * 8/1982 Jennings ..................... 29/25.42
5,530,411 A * 6/1996 Nakata et al. ............... 333/185
5,602,517 A * 2/1997 Kaneko et al. .............. 333/185
5,844,451 A * 12/1998 Murphy ....................... 333/185
5,977,845 A * 11/1999 Kitahara .................. 333/185 X

* cited by examiner

Primary Examiner—Justin P. Bettendorf
(74) Attorney, Agent, or Firm—Keating & Bennett, LLP

(57) ABSTRACT

An LC filter includes a capacitor with a small residual inductance, and having a good attenuation property up to a high frequency range, so as to achieve a strong attenuation at particular frequencies and also being adapted for use with a large current. Two coils including a metal plate arranged in a spiral shape, are disposed in a serially connected state so as to generate a mutual inductance therebetween. Also, a capacitor electrode plate has a shape which is included in the shape of the coils when viewed from the axial direction thereof, in the vicinity of the connection point of the coils so as to be opposed to a portion of the coils, whereby the portion of the coils functions as a capacitor electrode.

21 Claims, 10 Drawing Sheets

LC FILTER WITH CAPACITOR ELECTRODE PLATE NOT INTERFERING WITH FLUX OF TWO COILS

BACKGROUND OF THE INVENTION

1. Field of the Invention

The present invention relates to an LC filter, and more particularly, to an LC filter which utilizes the series resonance between a capacitor and an inductor to achieve a strong attenuation at particular frequencies, and to maintain the effects thereof at the high frequency range.

2. Description of the Related Art

Among LC filters, there is a laminated LC filter which includes a coil portion and a capacitor portion in a ceramic made by laminating ceramic sheets having electrode patterns forming a coil and a capacitor.

An example of such a laminated LC filter is disclosed in the Japanese Unexamined Patent Application Publications No. 10-13180 and No. 10-200357 which has an equivalent circuit as shown in FIG. 12. In this equivalent circuit, two coils L1 and L2 are connected in series between terminals 12a and 12b, and an equivalent coil L3 constituted by the mutual inductance M between the coils L1 and L2, a capacitor C, and a minute coil (minute inductor) L4 for adjusting the resonance frequency are connected in series between the node of the two coils L1 and L2 and a ground.

As shown in FIG. 12, if the mutual inductance M between the coils L1 and L2 is positive, this equivalently means that there exists a negative inductance (−M) (equivalent coil L3) between the node of the coils L1 and L2 and the ground. The resonance frequency, therefore, can be adjusted by connecting the minute coil (minute inductance) L4 in series with the capacitor C.

As shown in FIG. 13, if the mutual inductance M between the coils L1 and L2 is negative, this equivalently means that there exists a positive inductance (+M) between the node of the coils L1 and L2 and the ground, and the positive inductance generates a series resonance with the capacitor C. In this case, the resonance frequency can be adjusted by adjusting the coupling state of the positive inductance with the capacitor C and/or the coils L1 and L2.

However, in the LC filter as described above, at a specific resonance frequency, a strong attenuation is achieved by the resonance between the inductance and the capacitor C, but after the resonance point, the inductance connected in series to the capacitor increases the impedance, so that the effect provided by the capacitor becomes insufficient. Thus, the above-described LC filter cannot produce a sufficient attenuation effect over a wide frequency range while having a sufficient attenuation effect at particular frequencies.

Also, in the conventional laminated LC filter, the electrode patterns forming the coil portion and the capacitor portion are each designed, in consideration of the properties thereof, to include ceramic sheets on which these electrodes are printed and laminated in a desired order, and a magnetic flux passes through the electrode for the capacitor (capacitor electrode), that is, the capacitor electrode obstructs the magnetic flux. As a result, an eddy current occurs in the capacitor electrode, and the eddy current loss substantially reduces the inductance.

Among the conventional inductors suitable for large currents, there is an inductor formed by winding coated copper wiring around a ferrite ring core. To construct an LC filter using such an inductor, it is necessary to separately install a capacitor. This increases the number of components, and further a stray capacitance and a residual inductance are generated because the inductor and the capacitor are connected by connecting separate components, resulting in insufficient attenuation characteristics.

SUMMARY OF THE INVENTION

Accordingly, to overcome the above-described problems, preferred embodiments of the present invention provide an LC filter in which the stray capacitance and the residual inductance of a capacitor are minimized, and which achieves a strong attenuation property at particular frequencies by producing a series resonance by an equivalently generated mutual inductance, a residual inductance, and a capacitance, and maintaining the attenuation effect over a high frequency range by setting the value of the coupling coefficient between the two coils such that the coupling between the two coils cancels all residual inductance. The LC filter is suitable for high-current applications.

The laminated LC noise filter in accordance with a first preferred embodiment of the present invention includes a magnetic body and two coils disposed in the magnetic body, which are defined by a metallic plate having a spiral shape, and which are connected in series to generate a mutual inductance therebetween. A capacitor electrode plate, having a shape which is included within the shape range of the coils when viewed from the axial direction thereof such that it does not interfere with the magnetic flux generated by the coils, is disposed in the vicinity of the connection point of the two coils in the magnetic body such that at least a portion of the capacitor electrode plate is opposed to a portion of the coils.

By arranging the two spiral shaped coils to be serially connected to generate a mutual inductance, and disposing the capacitor electrode plate, in the vicinity of the connection point of the two coils so as to be opposed to a portion of the coils, the coils also act as a capacitor electrode. This reduces the number of components, and eliminates the need to provide a capacitor independently of the coils, resulting in greatly reduced residual inductance.

Also, because the capacitor electrode plate is configured to be included in the shape of the coils when viewed from the axial direction thereof, that is, a shape which does not to extend beyond the planar shape (projected shape) of the coils in plan view, the magnetic flux generated between the two coils does not pass through the capacitor electrode plate. This prevents a decrease in inductance due to eddy current loss, and achieves a greatly increased inductance.

Furthermore, by arranging the mutual inductance between the two coils to be positive or negative, an outstanding attenuation property at a high frequency range is achieved, and a strong attenuation at particular frequencies by a series resonance is also achieved.

In the LC filter of various preferred embodiments of the present invention, there is no particular limit to a specific shape or number of the capacitor electrode plates. The shape and number of the capacitor electrode plates is selected depending on the application.

Also, in the LC filter of various preferred embodiments of the present invention, there is no particular limit to the number of turns of the two coils. The number of turns of the two coils may be freely determined depending on application.

If the LC filter of various preferred embodiments of the present invention has an excessive coupling coefficient between the two coils, it will not achieve the effect of a T type filter which includes a distributed constant element, but it will possess only the property of a single coupled coil. Therefore, it is preferable to adjust the coupling coefficient between the two coils to an appropriate value. To enable the resonant frequency to be adjusted without sacrificing the attenuation property, it is preferable to set the coupling coefficient between the two coils in the range from approximately −0.1 to +0.1.

An LC filter in accordance with a second preferred embodiment of the present invention includes a magnetic body and two coils which are formed of a metallic plate having a spiral shape, which are connected in series to generate a mutual inductance, and which are aligned in the magnetic body in the axial direction thereof such that the central axes of the two coils are substantially the same. A capacitor electrode plate, which is configured to be included within the shape of the coils when viewed from the axial direction thereof so that it does not interfere with the magnetic flux generated by the coils, is disposed between the two coils in the magnetic body so that at least a portion of the capacitor electrode plate is opposed to a portion of the coils.

By disposing the two coils aligned in the axial direction thereof such that the central axes of the two coils are substantially the same, and by inserting the capacitor electrode plate between the two coils, an LC filter is provided which exhibits an effect similar to the LC filter in accordance with the first preferred embodiment. This enables the present invention to be highly effective.

The LC filter in accordance with a third preferred embodiment of the present invention includes a magnetic body and two coils which defined by a metallic plate having a spiral shape, which are connected in series to generate a mutual inductance therebetween, and which are disposed in the magnetic body to be spaced from each other in a direction that is substantially perpendicular to the axial direction of the coils so as to be adjacent to each other when the coils are viewed from the axial direction thereof. A capacitor electrode plate, having a shape which is included within the shape of the coils when viewed from the axial direction thereof such that it does not obstruct the magnetic flux generated by the coils, is disposed in the vicinity of the connection point of the two coils in the magnetic body such that at least a portion of the capacitor electrode plate is opposed to a portion of the coils.

As described above, by disposing the two coils at the locations displaced from each other in the direction that is substantially perpendicular to the axial direction of coils so as to be adjacent to each other when the coils are viewed from the axial direction thereof, and by disposing a capacitor electrode plate having a shape which does not obstruct the magnetic flux generated by the coils in the vicinity of the connection point of the two coils, an LC filter is provided which exerts an effect similar to the LC filter in accordance with the first preferred embodiment. This enables the present invention to be highly effective.

Preferably, the LC filter of various preferred embodiments of the present invention includes a magnetic body constructed of a magnetic resin obtained by kneading a resin with magnetic powder.

By using a magnetic resin obtained by kneading a resin with magnetic powder as a magnetic body, an LC filter having two coils and a capacitor electrode plate embedded in a magnetic body (magnetic resin) by an injection molding method or other suitable method is provided, and thus a high-inductance LC filter is efficiently produced, which permits the present invention to be highly effective.

Other features, characteristics, elements and advantages of the present invention will become more apparent from the following detailed description of preferred embodiments of the present invention with reference to the attached drawings.

BRIEF DESCRIPTION OF THE DRAWINGS

FIGS. 1A and 1B show an LC filter in accordance with a first preferred embodiment of the present invention, wherein FIG. 1A is a front view and FIG. 1B is a plan view;

FIGS. 2A and 2B shows coils included in the LC filter in accordance with the first preferred embodiment, wherein FIG. 2A is a front view and FIG. 2B is a plan view;

FIGS. 5A and 5B are diagrams showing an LC filter in accordance with a second preferred embodiment of the present invention, wherein FIG. 5A is a front view and FIG. 5B is a plan view;

FIGS. 6A and 6B are diagrams illustrating coils included in the LC filter in accordance with the second preferred embodiment, wherein FIG. 6A is a front view and FIG. 6B is a plan view;

FIGS. 8A and 8B are diagrams illustrating the LC filter in accordance with a third preferred embodiment of the present invention, wherein FIG. 8A is a front view and FIG. 8B is a plan view;

FIGS. 9A and 9B are diagrams illustrating coils composing the LC filter in accordance with the third preferred embodiment, wherein FIG. 9A is a front view and FIG. 9B is a plan view;

DETAILED DESCRIPTION OF PREFERRED EMBODIMENTS

The LC filter in accordance with a first preferred embodiment of the present invention will be described in detail with reference to FIGS. 1A through 4.

Figure 1A:
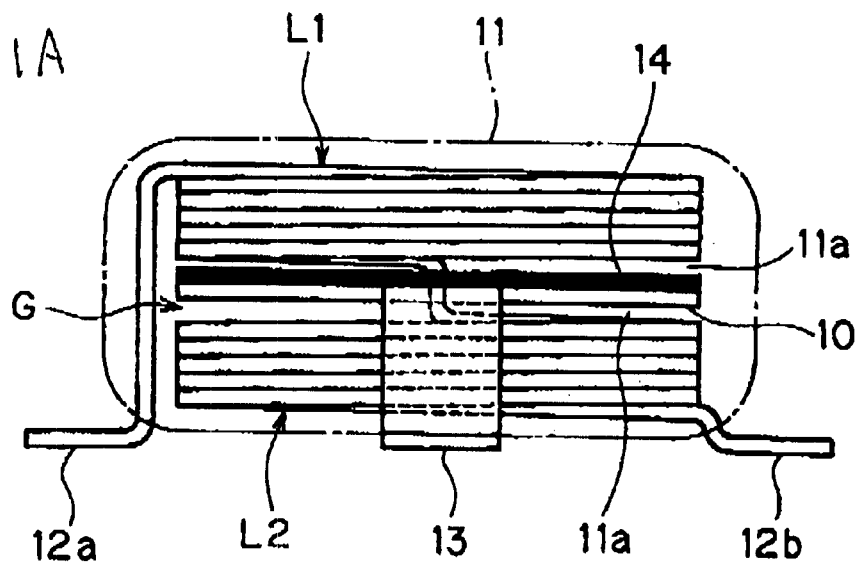
Figure 1B:
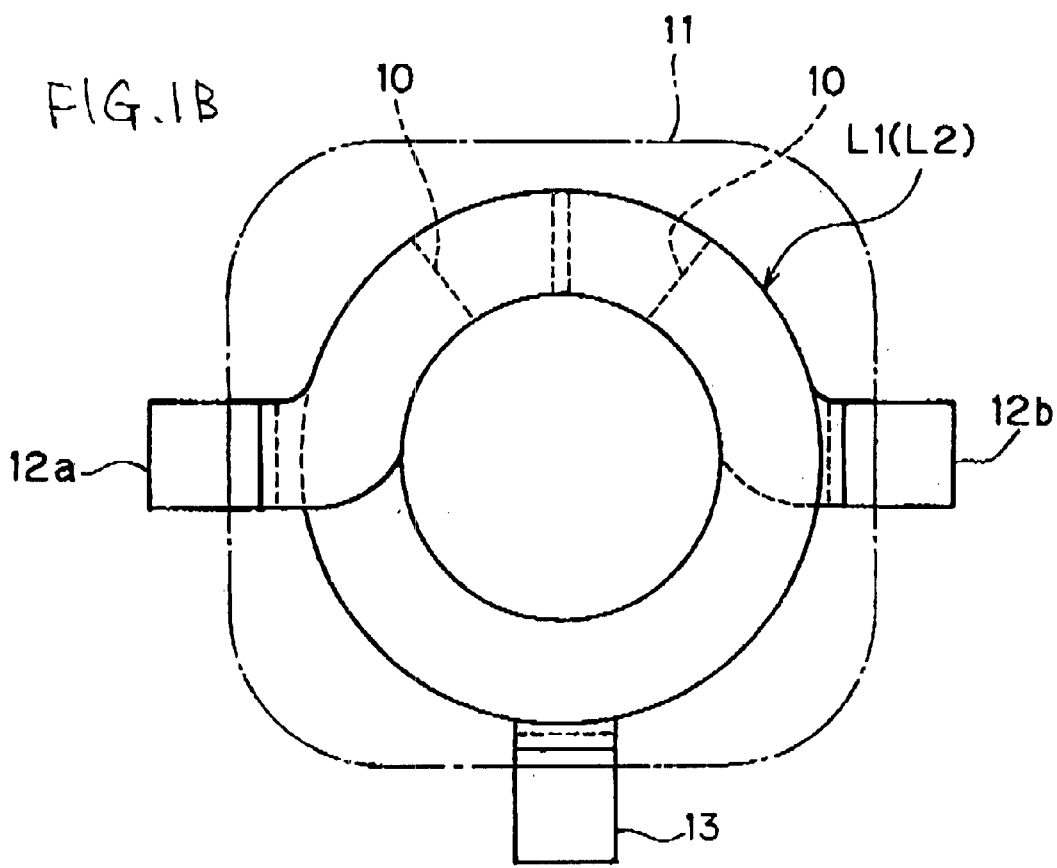

As illustrated in FIGS. 1A and 1B, this LC filter preferably includes two coils L1 and L2 embedded in a magnetic body 11 and connected in series, and disposed in alignment in the axial direction thereof so that the central axes of the two coils are coaxially disposed, and an electrode (capacitor electrode plate) 10 including a metallic plate having a capacitance and inserted between the two coils L1 and L2 to be sandwiched therebetween, and wherein an external terminal (coil terminal) 12a conducted to one end of the coil L1, an external terminal (coil terminal) 12b conducted to one end of the coil L2, and a grounding terminal 13 connected to the ground, conducted to the capacitor electrode plate 10 are disposed so as to be exposed outside the magnetic body 11.

Figure 2A:
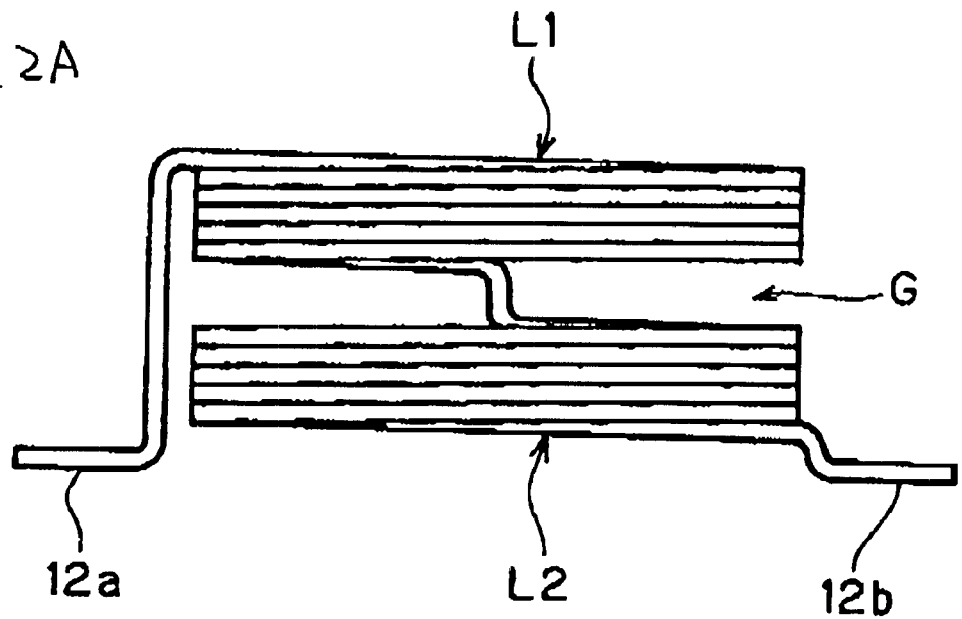
Figure 2B:
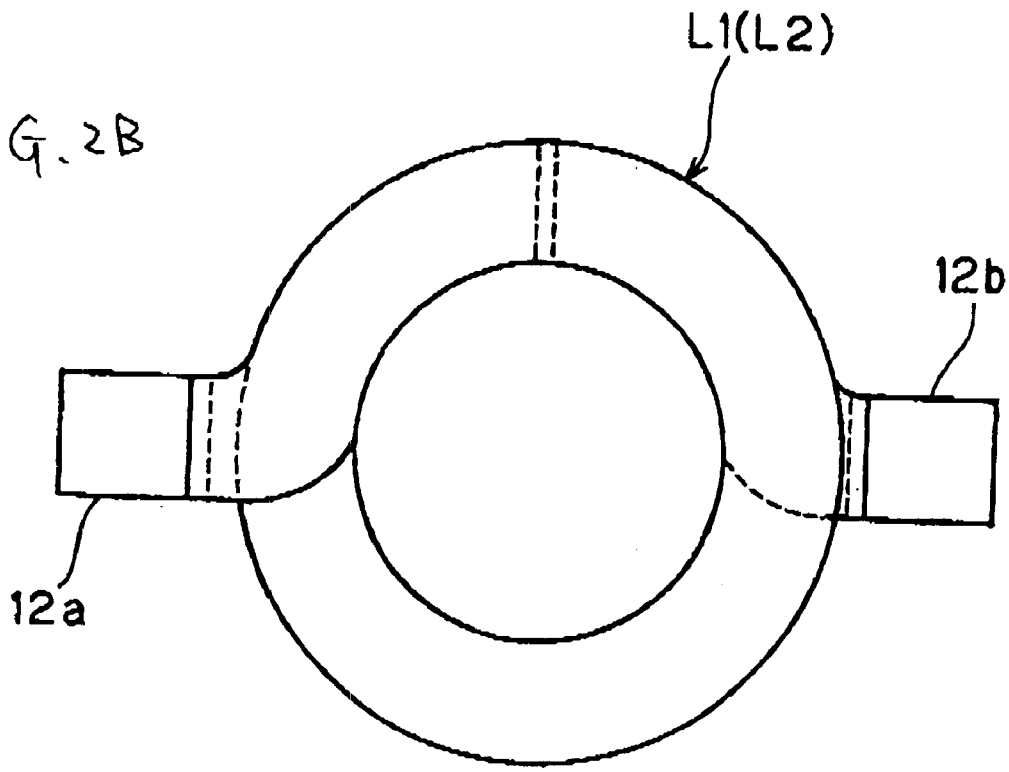

As shown in FIGS. 2A and 2B, the coils L1 and L2 each have an outer diameter of about 10 mm and an inner diameter of about 6 mm defined by winding an insulation-coated conductor of an elongated planar (strip-like) shape, having a thickness of about 0.25 mm and a width of about 2.0 mm. The total number of turns of the coils L1 and L2 is approximately ten: approximately five turns on the upper side constitute the coil L1, and approximately five turns on the lower side constitute the coil L2.

Figure 3:
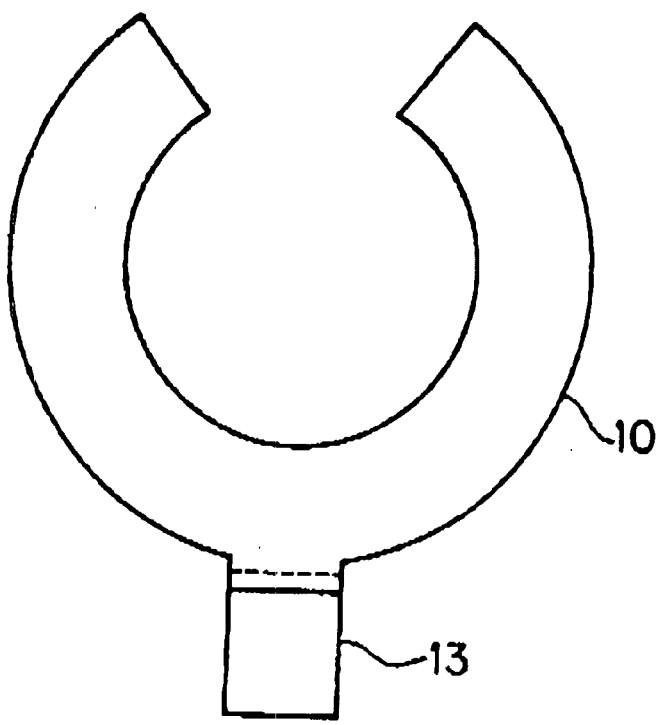
FIG. 3 is a plan view showing a capacitor electrode plate included in the LC filter in accordance with the first preferred embodiment.

As illustrated in FIG. 3, the capacitor electrode plate 10 is made by arranging a metallic plate so as to be included in the planar shape of the coils L1 and L2 in plan view, and the main portion of the capacitor electrode plate 10 has substantially the same planar shape (substantially horse-shoe shape) as that of each of the coils L1 and L2. At a predetermined position on the outer peripheral portion of the capacitor electrode plate 10, a protrusion constituting a grounding terminal 13 is formed for connection to the ground.

In the LC filter of the first preferred embodiment, a gap G is provided between the coil L1 and the coil L2 for adjusting the degree of coupling between the coils L1 and L2, and for securing a space where the capacitor electrode plate is to be inserted and disposed. In this first preferred embodiment, the size of the gap G is preferably about 1 mm.

In addition, in the LC filter of the first preferred embodiment, a resin disk 14 having the same inner and outer diameters as those of the coils L1 and L2 and a thickness of about 0.25 mm is inserted into the gap G and is disposed on one side (the upper surface side) of the capacitor electrode plate 10 inserted into the gap G to adjust the degree of coupling between the coils L1 and L2.

As the magnetic body 11, a resin base magnetic material (magnetic resin) obtained by kneading a resin with magnetic powder such as ferrite powder is used. By injection-molding this magnetic resin while retaining the above-described coils L1 and L2, the capacitor electrode plate 10, and the resin disc 14 at predetermined positions, the LC filter such as that shown in FIGS. 1A and 1B is produced.

In the LC filter of the first preferred embodiment, the directions of the magnetic fluxes generated by the two coils L1 and L2 which are connected in series are the same, and the mutual inductance (M) between them is positive.

The degree of coupling between the coils L1 and L2 is controlled by the following methods:

(1) The method in which the distance (the above-mentioned gap G) between the two coils L1 and L2 is adjusted.

(2) The method in which a layer having different permeability is provided between the two coils L1 and L2.

(3) The method in which a property of the magnetic body 11 is changed (for example, the kind or composition of the magnetic body is changed).

In the first preferred embodiment, the above methods (1) and (2) are preferably used.

Specifically, in the LC filter of the first preferred embodiment, the degree of coupling between the coils L1 and L2 is adjusted by setting the distance between the coils L1 and L2 to about 1 mm, and interposing the non-magnetic resin disk 14 in the gap G between the coils L1 and L2.

In the LC filter having the features described above, since the capacitor electrode plate 10 inserted between the two coils L1 and L2 which are connected in series has substantially the same shape (horse-shoe shape) as included in the shape of the coils L1 and L2 in plan view, the magnetic fluxes generated around the coils L1 and L2 are not interfered by the capacitor electrode plate 10, that is, there is no conductive matter in the path of the flux. This prevents the occurrence of eddy current loss and achieves a high inductance.

Since the capacitor electrode plate 10 inserted between the two coils L1 and L2 and opposed to the coils L1 and L2 via a magnetic layer 11a, has substantially the same planar shape as the coils L1 and L2 defined by winding an insulation-coated conductor of an elongated planar (strip-like) shape, a wide area of opposing surfaces between the coils L1 and L2 is achieved, which also define capacitor electrode plates, and the capacitor electrode plate 10, which allows attainment of a large capacitance. Here, adjustment of the capacitance is easily performed by adjusting the size or shape of the capacitor electrode plate 10, or by adjusting the number of capacitor electrode plates 10 provided.

Also, since the capacitor is defined by the coils L1 and L2 and the capacitor electrode plate 10, a capacitor does not need to be separately connected, unlike the case where an LC filter is formed of an individual inductor and capacitor. Thus, a significant reduction in the residual inductance due to the connection of the coils L1 and L2 and a capacitor is achieved.

Figure 4:
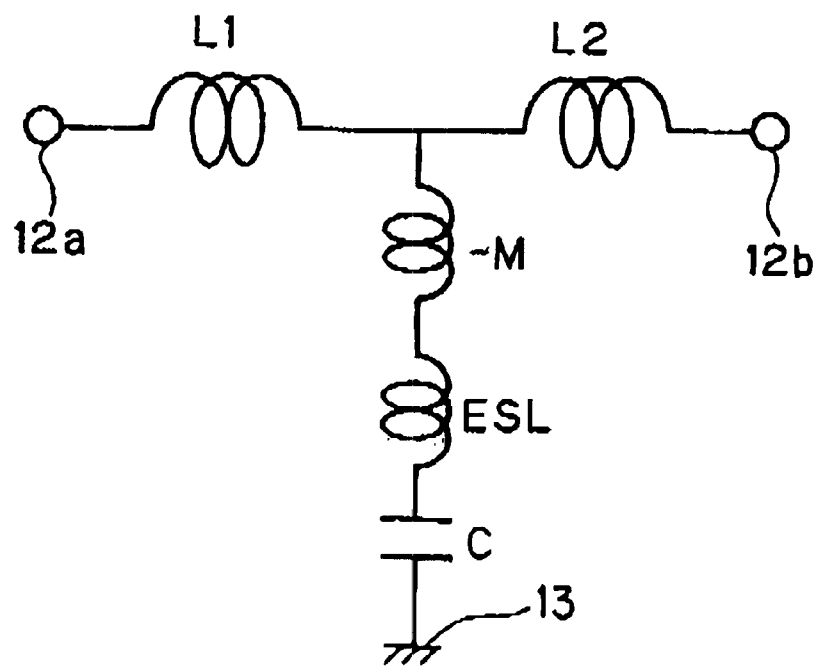
FIG. 4 is a diagram showing the equivalent circuit of the LC filter in accordance with the first preferred embodiment.
Figure 5A:
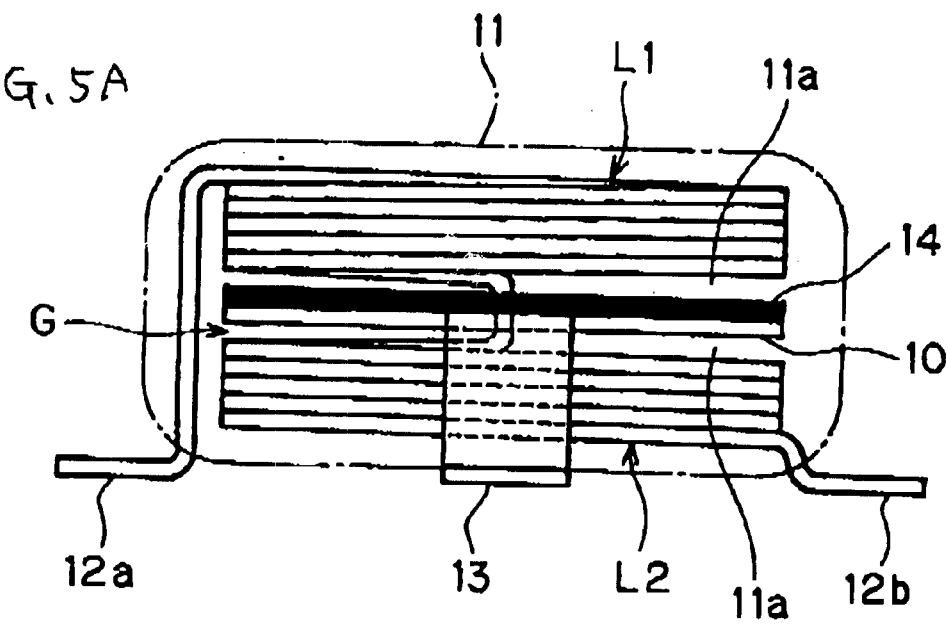
Figure 5B:
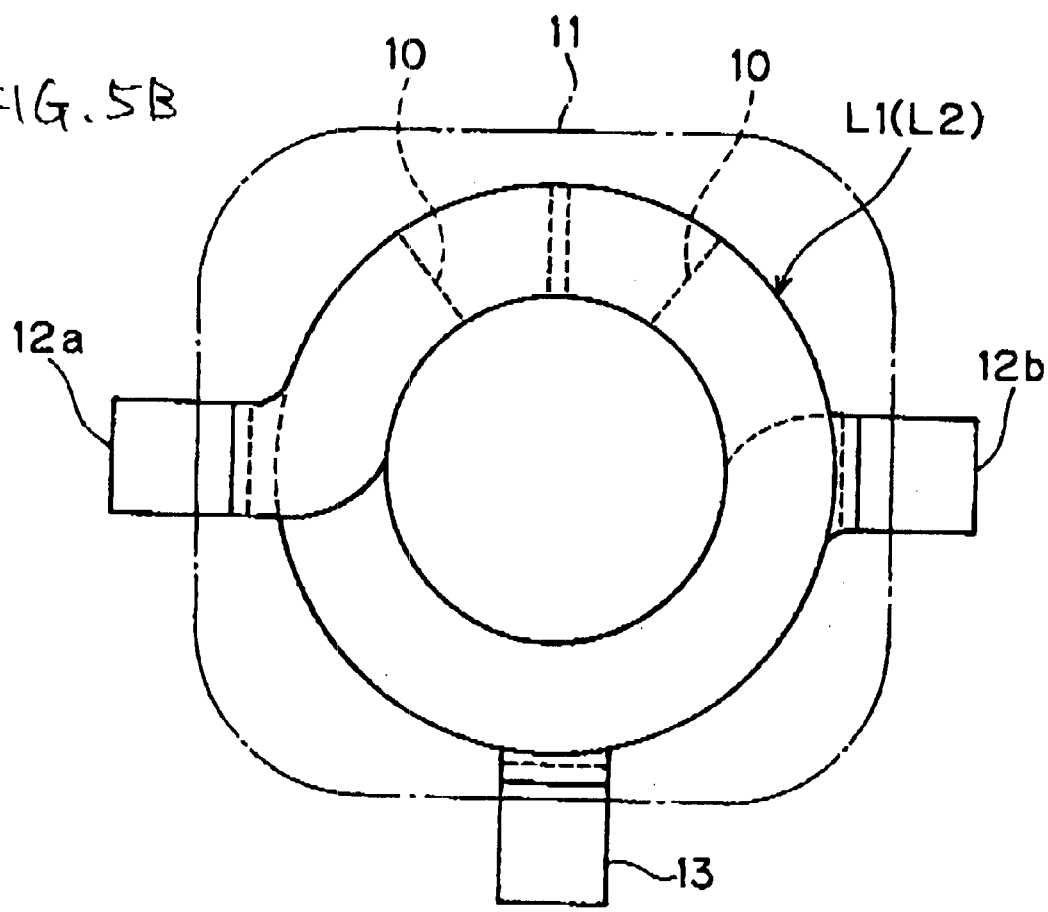
Figure 6A:
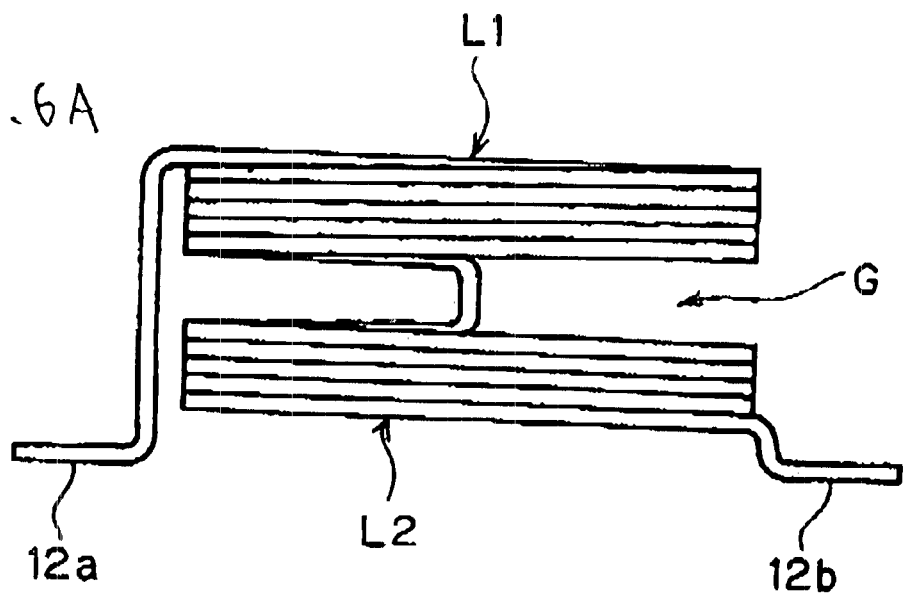
Figure 6B:
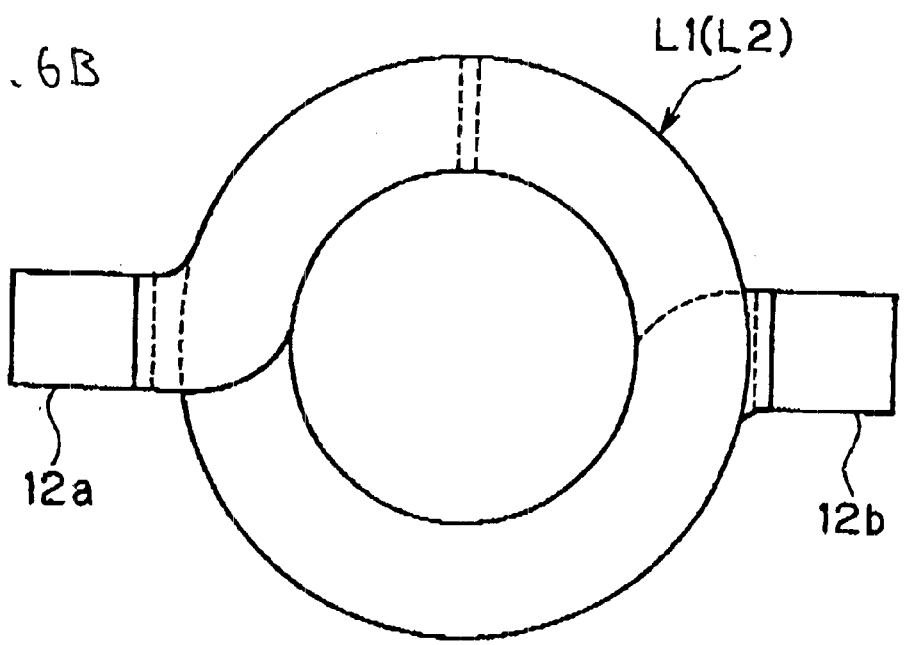
Figure 7:
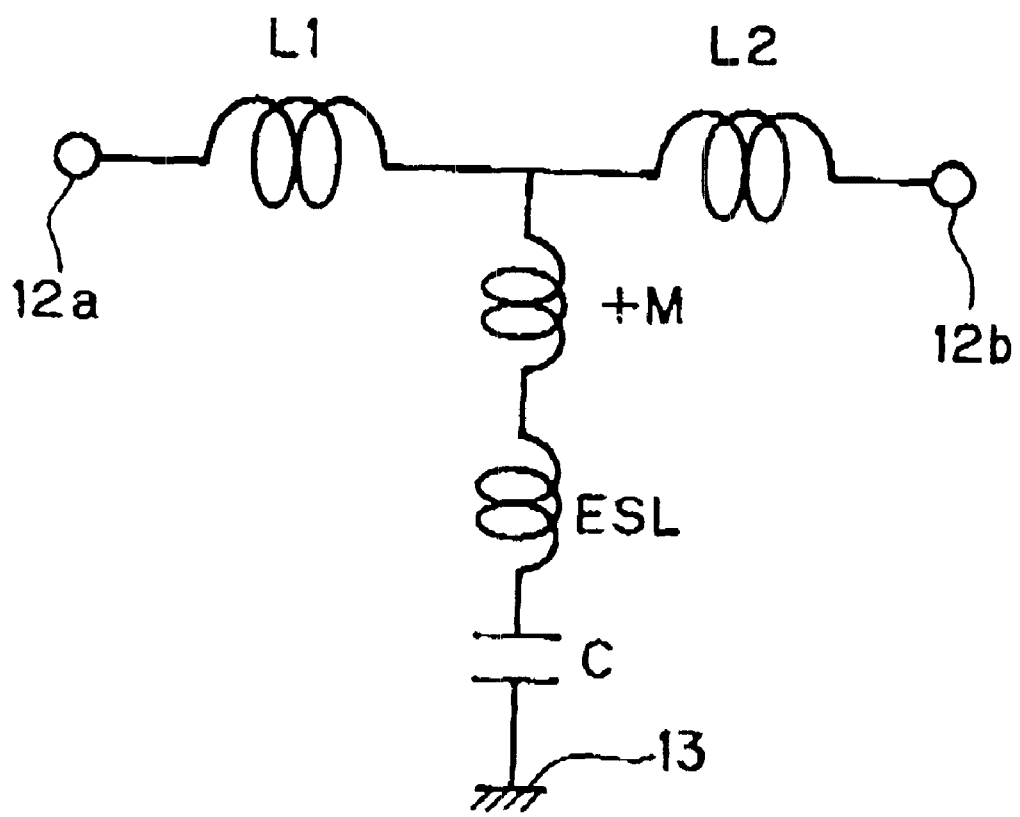
FIG. 7 is a diagram illustrating the equivalent circuit of the LC filter in accordance with the second preferred embodiment.
Figure 8A:
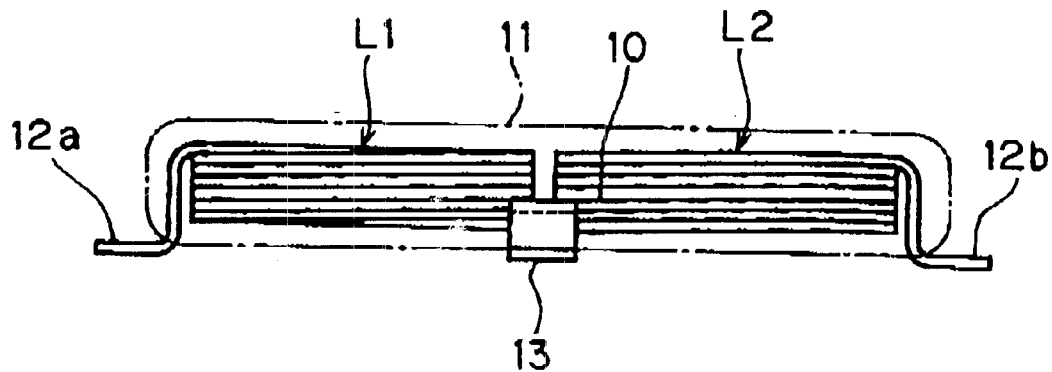
Figure 8B:
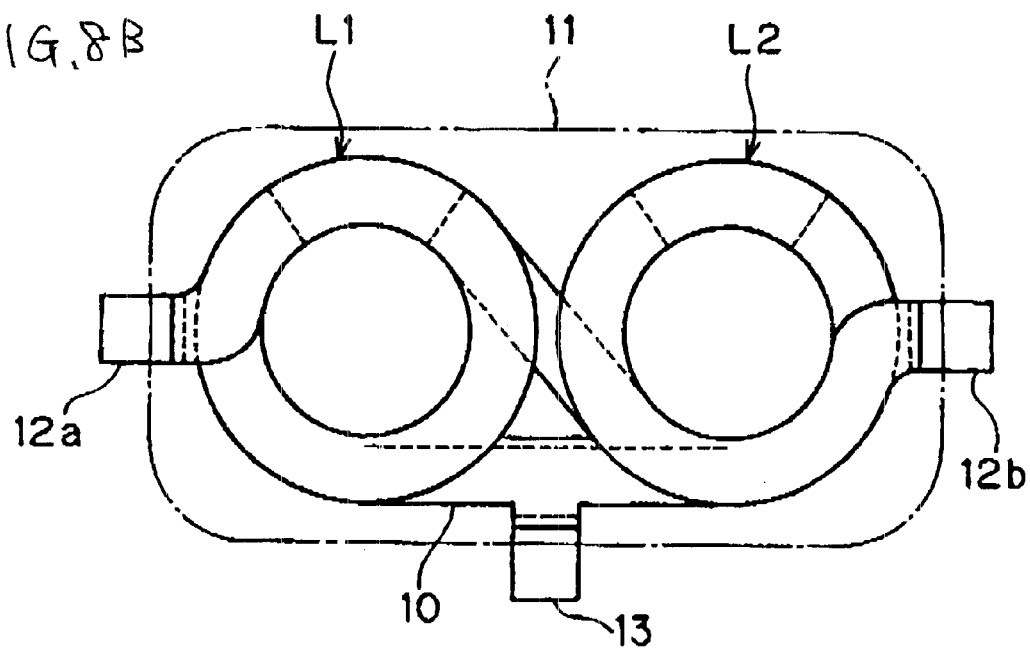
Figure 9A:
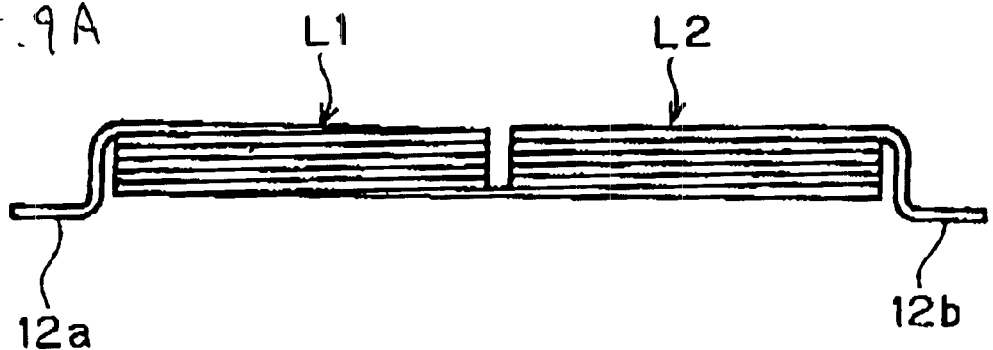
Figure 9B:
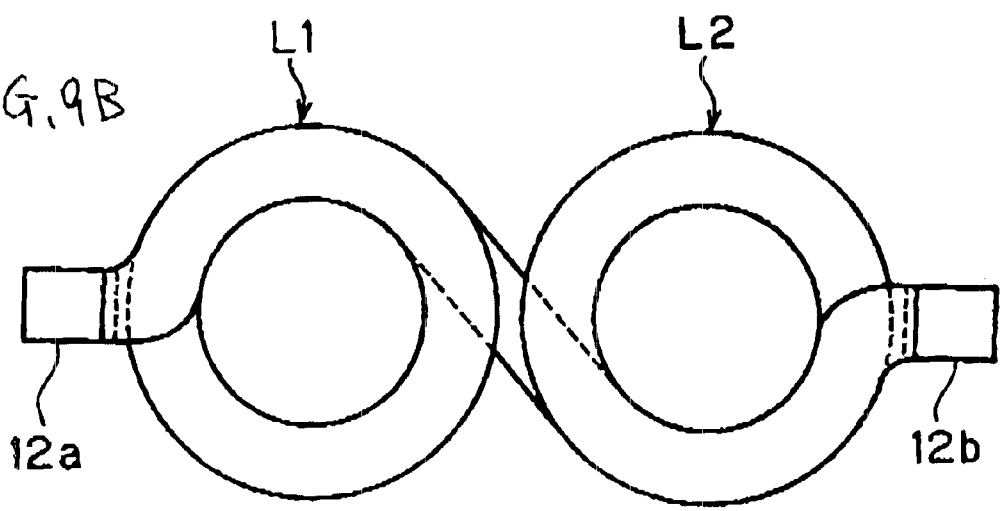
Figure 10:
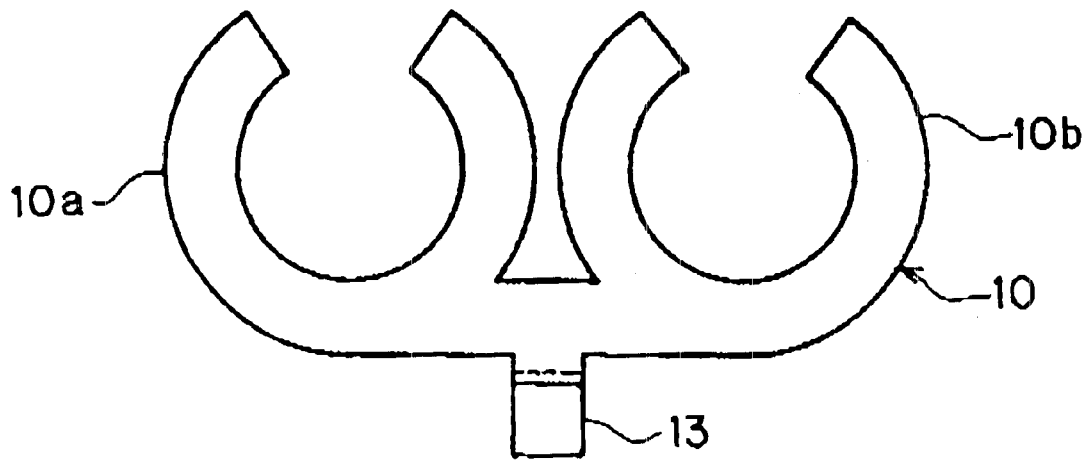
FIG. 10 is a plan view illustrating a capacitor electrode plate composing the LC filter in accordance with the third preferred embodiment.
Figure 11:
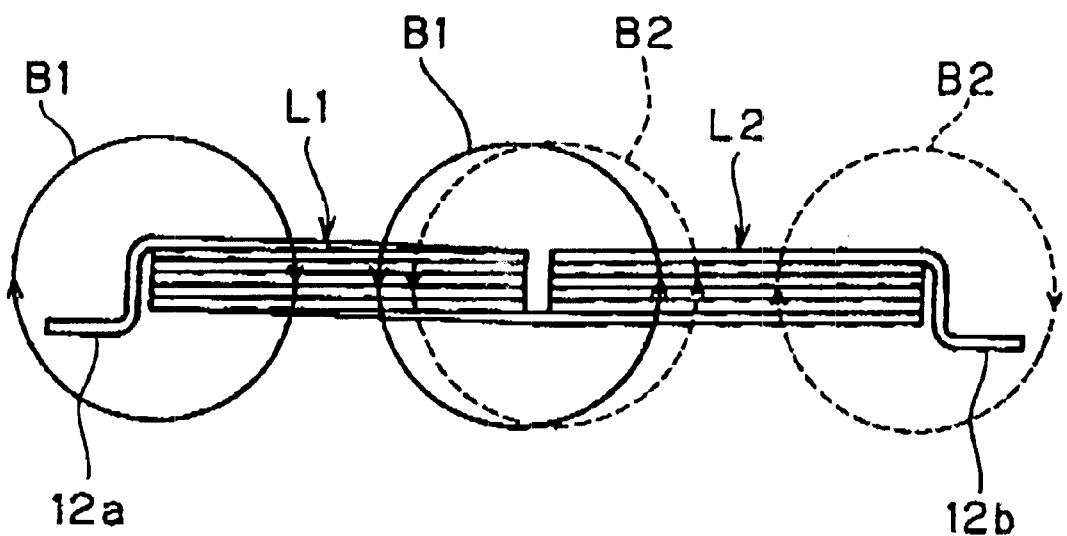
FIG. 11 is a diagram showing the directions of the magnetic fluxes passing through the coils of the LC filter in accordance with the third preferred embodiment.
Figure 12:
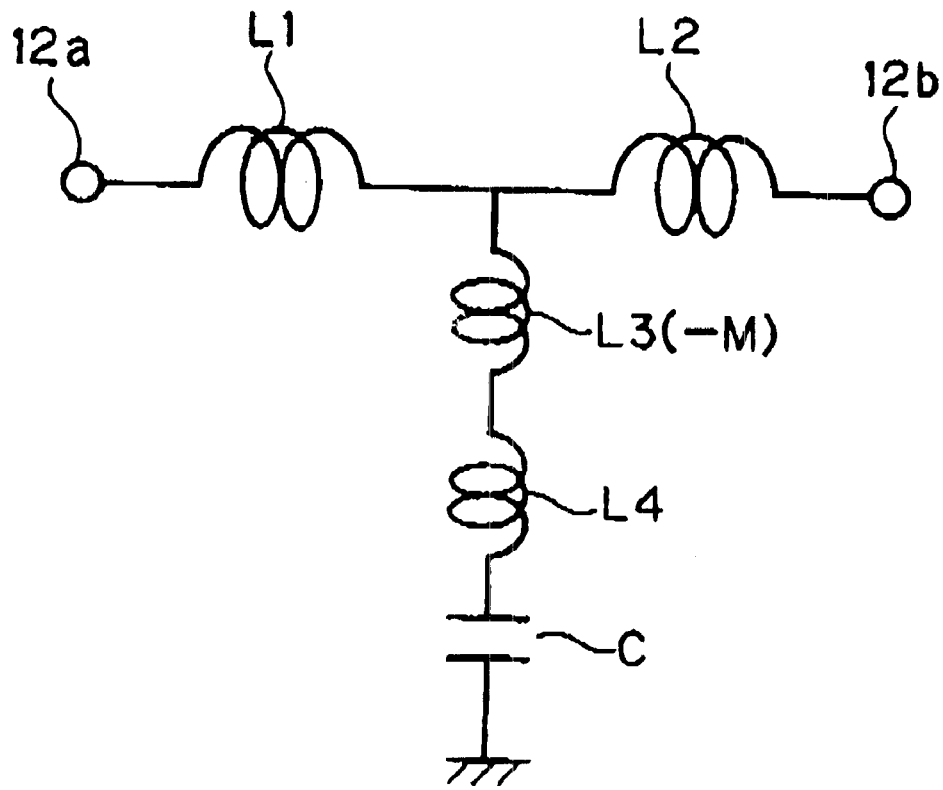
FIG. 12 is a diagram showing the equivalent circuit of a conventional LC filter.
Figure 13:
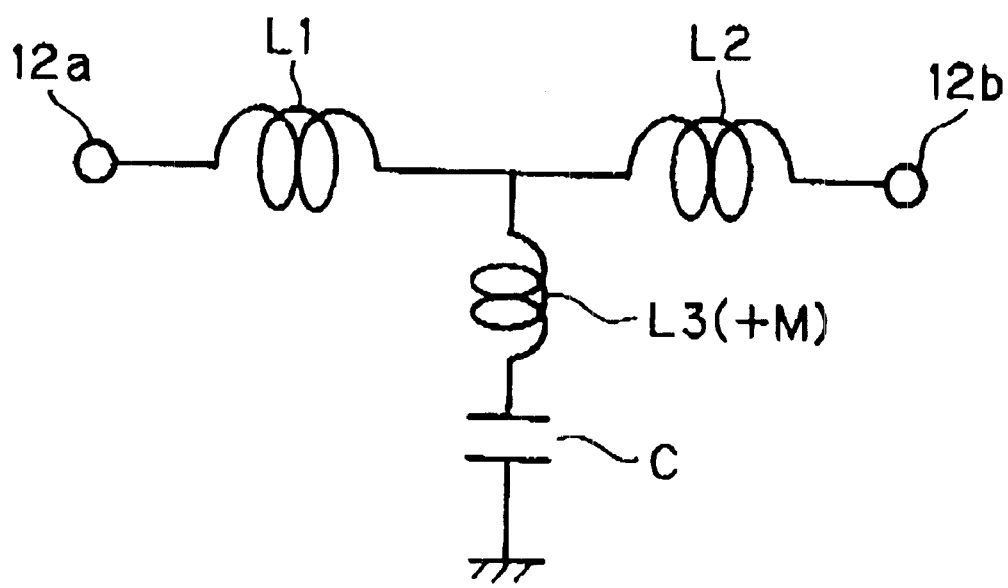
FIG. 13 is a diagram showing the equivalent circuit of another conventional LC filter.

The equivalent circuit of the LC filter of the above-described first preferred embodiment is illustrated in FIG. 4. Since the mutual inductance M between the coils L1 and L2 is positive, a negative inductance (–M) exists between the node of the coils L1 and L2 and the ground. This inductance (–M), a residual inductance (ESL: Equivalent Series Inductance), and a capacitance (C), therefore, define a series circuit in this equivalent circuit of the LC filter of the first preferred embodiment.

In the circuit where a residual inductance and a capacitor are connected in series, series resonance occurs, and at the resonance point, attenuation grows, but beyond the resonance point, the attenuation decreases due to an increase in impedance.

However, since the LC filter of the first preferred embodiment is constructed so that a negative inductance (–M) is connected in series, the residual inductance (ESL) is canceled by adjusting the degree of coupling between the two coils so that the negative inductance (–M) equals the residual inductance (ESL) in the equivalent circuit. This enables the formation of an LC filter capable of having an attenuation effect up to a high frequency range by suppressing the occurrence of series resonance.

As described above, not only changing the degree of coupling between the coils L1 and L2, but also adjusting the capacitance provides a change of the frequency range capable of exerting a residual inductance suppressing effect.

Here, the properties of the LC filter of the above-described first preferred embodiment were measured. In accordance with the measured result, the inductance of this LC filter was about 1.7 $\mu$H.

Also, the inductance was about 0.8 $\mu$H when it was measured in the state of only one coil (L1 or L2) out of the two coils being molded of the same resin including magnetic powder as the magnetic body 11.

Therefore, the mutual inductance between the two coils is about 0.05 $\mu$H, and the coupling coefficient is about 0.06.

Specifically, since the inductance of only one coil L1 or L2 is about 0.8 $\mu$H and the inductance value of the entire LC filter (total L value) is about 1.7 $\mu$H, denoting the inductance values of the coils L1 and L2 to be XL1 and XL2, respectively, and the mutual inductance value between the two coils be M, $$\text{Total } L=1.7 \ \mu\text{H}=(XL1+M)+(XL2+M)=(0.8 \ \mu\text{H}+M)+(0.8 \ \mu\text{H}+M)$$

That is, the mutual inductance M is about 0.05 μH.

Thus, the LC filter of the first preferred embodiment has an inductance of about −0.05 μH (negative inductance −M) between the node of the coils L1 and L2 and the ground) and is connected in series with a capacitor and a residual inductance.

Meanwhile, in the LC filter of the first preferred embodiment, since the resin disk 14 is inserted into the gap to overlap the capacitor electrode plate 10, the degree of coupling between the two coils L1 and L2 is very low.

Furthermore, in the LC filter of the first preferred embodiment, although the value of ESL has not been measured, the value of ESL is considerably less than 0.05 μH, so that no resonance is generated in the LC filter of the first preferred embodiment.

Also, the capacitance measured between the external terminals (coil terminals) 12a and 12b, and the grounding terminal 13 is 22 pF.

The transmission attenuation of this LC filter was measured by a network analyzer. In accordance with the measured results, an attenuation at a rate of about 60 dB/decade started at about 50 MHz, and an attenuation of about 40 dB was obtained at about 100 MHz. Also, an attenuation property at a rate of about 20dB/decade was observed from about 200 MHz, and an attenuation of about 50 dB was obtained at about 300 MHz.

For comparison, an LC filter (comparative example) which did not have the resin disk 14 inserted between the coils L1 and L2 was made and the properties thereof were measured. The inductance of the LC filter of this comparative example was 2.3 μH, the mutual inductance was 0.35 μH, and the coupling coefficient was 0.44.

In this comparative example of the LC filter, the attenuation started at about 70 MHz, and the attenuation rate was about 20 dB/decade, that is, large attenuation effect as in the case of the above-described first preferred embodiment was not achieved. Thus, when the degree of coupling between the two coils L1 and L2 is too high, the two coils connected in a T-type filter structure function as if they are a single coil.

As described earlier, in the LC filter having the features of this preferred embodiment of the present invention, it is preferable to that the coupling coefficient of the two coils is within the range from about −0.1 to about +0.1 to permit the resonant frequency to be adjusted without sacrificing the attenuation properties.

An LC filter in accordance with a second preferred embodiment of the present invention will now be described in detail with reference to FIGS. 5A through 7.

In the LC filter of the second preferred embodiment, as in the case of the above-described first preferred embodiment, two coils L1 and L2 are arranged such that each have an outer diameter of about 10 mm, an inner diameter of about 6 mm, and approximately five turns by winding an insulation-coated conductor of an elongated planar (strip-like) shape having a thickness of about 0.25 mm and a width of about 2.0 mm. The two coils L1 and L2 are arranged so that the central axes thereof coaxial, but in the LC filter of the second preferred embodiment, the coils L1 and L2 are connected so that the directions of currents flowing through the two coils are opposite to each other when the electric current is applied to them. That is, in the LC filter of the second preferred embodiment, the coils L1 and L2 are configured so that the winding directions are opposite to each other in the two coils.

In the gap G between the coils L1 and L2, a capacitor electrode plate 10 having the same structure and shape as those of the LC filter of the above-described first preferred embodiment (see FIG. 3) is inserted.

With respect to other structures, the manufacturing method, etc., the LC filter of the second preferred embodiment is the same as the LC filter of the above-described first embodiment, and therefore an explanation thereof is omitted and the corresponding portions of the explanation of the first preferred embodiment is utilized to avoid repetition.

In FIGS. 5A to 6B (the second preferred embodiment), the elements marked with the same reference numerals as those in FIGS. 1A through 3 (the first preferred embodiment) refer to the same or equivalent elements as those in FIGS. 1A through 3 (the first embodiment).

In the LC filter of the second preferred embodiment, the directions of the magnetic fluxes generated between the two coils L1 and L2 are opposite to each other, and the mutual inductance between them is negative (−M).

Since the mutual inductance (M) between the coils L1 and L2 is negative, there exists a positive inductance (+M) between the node of the coils L1 and L2 and the ground. This inductance (+M), a residual inductance (ESL), and a capacitance (C), therefore, define a series circuit in the LC filter of the second preferred embodiment.

Accordingly, also in the LC filter of the second preferred embodiment, by changing the mutual inductance (−M) through adjusting the degree of coupling between the two coils L1 and L2, the resonance point is changed and the attenuation effect at particular frequencies is changed.

The adjustment of the degree of coupling between the coils L1 and L2 is easily performed, as in the case of the first preferred embodiment, by methods such as adjusting the gap G between the coils L1 and L2, changing the properties of the magnetic body 11, inserting a layer (resin disk for the first embodiment) having a different permeability between the coils L1 and L2, and so on. Also, the adjustment of capacitance is easily performed by adjusting the size, shape, or number of the capacitor electrode plates. By thus adjusting the degree of coupling of the coils L1 and L2 and the capacitance, the frequency range capable of obtaining a residual inductance suppressing effect is changed.

Here, the properties of the LC filter of the above-described second preferred embodiment were measured. The inductance was about 0.8 μH when it was measured in the state of only one coil (L1 or L2) out of the two coils being molded of the same resin including magnetic powder as the magnetic body 11.

Also, the inductance of the LC filter of the above-described second preferred embodiment was about 1.5 μH. Therefore, the mutual inductance between the two coils is about −0.05 μH, and the coupling coefficient is about −0.06.

Thus, the LC filter of the second preferred embodiment having an inductance of about +0.05 μH (a positive inductance (+M) between the node of the coils L1 and L2 and the ground) is connected in series with a capacitor and a residual inductance.

The capacitance measured between the external terminals (coil terminals) 12a and 12b and the grounding terminal 13 was about 22 pF.

Next, the transmission attenuation of this LC filter was measured by a network analyzer. In accordance with the measured results, the attenuation started at about 50 MHz, and an attenuation peak appeared at about 100 MHz, whereafter an attenuation of about 50 dB was maintained.

For comparison, an LC filter (second comparative example) which did not have the resin disk 14 inserted between the coils L1 and L2, was made and the properties thereof were measured. The inductance of the LC filter of this comparative example was about 1.0 $\mu$H, the mutual inductance was about −0.3 $\mu$H, and the coupling coefficient was about −0.38.

The capacitance measured between the coil terminals and the grounding terminal was about 22 pF. The attenuation started at about 40 MHz, and an attenuation peak due to the series resonance appeared at about 50 MHz. The resonance frequency can thus be significantly shifted as compared with above-described LC filter of the second preferred embodiment, but the attenuation after the resonance point was about 20 dB, thus the effect of this second comparative example heavily decreases except for the resonance point. Although this LC filter of the second comparative example can further lower the resonance point by increasing the coupling coefficient, the attenuation effect thereof after the resonance point is not as high as expected.

This indicates that the degree of coupling between the two coils L1 and L2 has a negative value which is too high and provides undesirable results. Also in the LC filter having the configuration of the second preferred embodiment, it is preferable that the value of the coupling coefficient between the coils is within a range from about −0.1 to about +0.1 to allows the resonance point of this LC filter to be adjusted and also to achieve a sufficient attenuation.

An LC filter in accordance to a third preferred embodiment of the present invention will now be described in detail with reference to FIGS. 8A through 11. In FIGS. 8A through 11 (the third preferred embodiment), the elements marked with the same reference numerals as those in FIGS. 1A through 3 (the first preferred embodiment) refer to the same or equivalent elements as those in FIGS. 1A through 3 (the first preferred embodiment).

As shown in FIGS. 8A, 8B, 9A and 9B, in the LC filter of the third preferred embodiment, the two coils L1 and L2 are connected in series and are embedded in the magnetic body 11 adjacent to each other in plan view, that is, so that the axial directions of the coils are substantially parallel with each other while the coils L1 and L2 are displaced from each other in the horizontal direction to be adjacent to each other in the direction that is substantially perpendicular to the axial directions of the coils. Furthermore, an electrode (capacitor electrode plate) 10 (see FIG. 10), which includes a metallic plate and which has two horse-shoe-shaped portions 10a and 10b, is provided in the vicinity of the connection point under the two coils L1 and L2.

An external terminal (coil terminal) 12a connected to one end of the coil L1, an external terminal (coil terminal) 12b connected to one end of the coil L2, and a grounding terminal 13, for connection to the ground, connected to the capacitor electrode plate 10, are exposed outside the magnetic body 11.

In the LC filter of the third preferred embodiment, two coils L1 and L2 are connected in series by winding an insulation-coated conductor of an elongated planar (strip-like) shape having a thickness of about 0.25 mm and a width of about 2.0 mm, such that each of the coils has an outer diameter of about 10 mm, an inner diameter of about 6 mm, and five turns, and so that the winding directions are opposite to each other in the two coils, that is, so that the directions of currents flowing through the two coils is opposite to each other.

As the magnetic body 11, a resin base magnetic material (magnetic resin) obtained by kneading a resin with magnetic powder such as ferrite powder is used, as in the case of the LC filter of above-described first and second preferred embodiments. By injection-molding this magnetic resin while retaining the coils L1 and L2 and the capacitor electrode plate 10 at desired positions, the LC filter as shown in FIG. 8 is formed.

Also, the capacitor electrode plate 10 includes a metallic plate arranged to be included in the planar shapes of the coils L1 and L2 in plan view, as in the cases of the first and second preferred embodiments, and a protrusion constituting a grounding terminal 13 is provided for connection to the ground at a desired position on the outer peripheral portion of the capacitor electrode plate 10.

In the LC filter of the third preferred embodiment, the two coils L1 and L2 are connected in series and configured such that the directions of currents flowing through the two coils are opposite to each other, more particularly, the direction of a magnetic flux B1 generated in the coil L1 and the direction of a magnetic flux B2 generated in the coil L2 adjacent to the coil L1 are opposite to each other. As a result, when the magnetic flux of one coil L1 (or L2) passes through the central portion of the other coil L2 (or L1), the directions of the magnetic fluxes of the two coils are the same, and thereby a positive mutual inductance (+M) is produced between the two coils. That is, the LC filter of the third preferred embodiment has the same equivalent circuit (see FIG. 4) as that of the LC filter of the above-described first preferred embodiment.

Also in the LC filter of the third preferred embodiment, since the capacitor electrode plate is included in the shape of the coils L1 and L2 in plan view, the magnetic flux generated of the two coils L1 and L2 is not obstructed by the capacitor electrode plate, and thus eddy current losses are prevented.

Therefore, the same effect as that of the LC filter of the first preferred embodiment is exhibited in the LC filter of the third preferred embodiment.

The properties of the LC filter of the above-described third preferred embodiment were measured. The inductance of the entire LC filter (entire coil) is about 1.65 $\mu$H. Also, the inductance of only one coil (L1 or L2) is about 0.8 $\mu$H.

Therefore, the mutual inductance between the two coils is about 0.025 $\mu$H, and the coupling coefficient is about 0.03. The capacitance obtained by the capacitor electrode plate 10 is about 80 pF.

Also in the LC filter of the third preferred embodiment, the attenuation started at about 27 MHz, and an attenuation of 60 dB was obtained at 300 MHz.

In the LC filter of the third preferred embodiment, the LC filter is constructed to generate a positive mutual inductance between the two coils. However, the LC filter may be constructed to generate a negative mutual inductance (−M) by constructing the LC filter to have the directions of currents flowing through the two coils L1 and L2 be the same, and that thereby the direction of the magnetic flux generated in one coil L1 and that of the magnetic flux generated in the coil L2 adjacent to the coil L1 is the same. Thus, when the magnetic flux of one coil L1 (or L2) passes through the central portion of the other coil L2 (or L1) the directions of the magnetic fluxes of the two coils is opposite to each other, thereby producing the negative mutual inductance (−M). In this case, an LC filter which exhibits the same effects as that of the LC filter of the above-described second preferred embodiment is obtained.

In the above-described first to third preferred embodiments, LC filters where each of the two coils has a planar configuration of a substantially circular (toroidal) shape have been explained by way of examples. However, the specific shape of the coils is not limited to these shapes, and coils with various shapes such as an ellipse, a rectangle, or other suitable shapes may be used.

Furthermore, in the above-described preferred embodiments, a resin with magnetic powder have been used as a magnetic body, however, the present invention may also be applied to an LC filter using a ceramic-based magnetic material in place of the resin-based material.

Also in other respects, the present invention is not limited to the above-described preferred embodiments. With regard to the material of a coil, the number of turns, the distance between the two coils, and the size, shape and number of capacitor plates, various changes and modifications are possible within the scope of the invention.

As described above, in the LC filter in accordance with the first preferred embodiment of the present invention, two coils include a metallic plate having a substantially spiral shape, and which are connected in series so as to generate a mutual inductance. A capacitor electrode plate which is included within the shape of the coils when viewed from the axial direction thereof, is disposed in the vicinity of the connection point of the two coils to be opposed to a portion of the coils. Therefore, the coils molded of a metallic plate also define capacitor electrodes. This permits a reduction in the number of components, and eliminates the need to form a capacitor independently of the coils, resulting in the suppression of a residual inductance to a low value.

Moreover, since a magnetic flux does not pass through the capacitor electrode plate, a reduction in inductance due to eddy current loss is prevented, which leads to the attainment of a large inductance.

In addition, since the coil is formed of a metallic plate, the LC filter is efficiently manufactured. Also, since the coil is used for a large current, the operational range of the LC filter is greatly increased.

Also, by arranging the mutual inductance between the two coils to be positive or negative, an excellent attenuation property up to a high frequency range is achieved and an attenuation at particular frequencies is also achieved.

In the LC filter in accordance with the second preferred embodiment of the present invention, by disposing the two coils including a spiral metallic plate, in alignment in the axial direction so that the central axes of the two coils are substantially the same, and by disposing a capacitor electrode plate between the two coils, an LC filter exhibiting effects similar to the LC filter in accordance with the first preferred embodiment is provided. This enables the present invention to be highly effective.

In the LC filter in accordance with the third preferred embodiment of the present invention, by disposing the two coils at positions displaced in the direction that is substantially perpendicular to the axial direction of coils so as to be adjacent to each other when viewed from the axial direction of the coils, and a capacitor electrode plate having a shape which does not obstruct the magnetic flux generated by the coils in the vicinity of the connection point of the two coils, an LC filter which exhibits effects similar to the LC filter in accordance with the first preferred embodiment is provided. This enables the present invention to be highly effective.

Furthermore, as described above, by using a magnetic resin obtained by kneading a resin with magnetic powder, as a magnetic body, an LC filter having two coils and a capacitor electrode plate embedded in a magnetic body (magnetic resin) by injection molding method or other suitable method is provided, and thereby efficiently provide a high-inductance LC filter, which permits the present invention to be highly effective.

It should be understood that the foregoing description is only illustrative of the present invention. Various alternatives and modifications can be devised by those skilled in the art without departing from the invention. Accordingly, the present invention is intended to embrace all such alternatives, modifications and variations which fall within the scope of the appended claims.

What is claimed is:

1. An LC filter comprising:
   a magnetic body;
   at least two coils including a metallic plate having a spiral shape, said at least two coils connected in series so as to generate a mutual inductance therebetween, and said at least two coils being disposed in said magnetic body;
   a capacitor electrode plate which is included within the shape of said at least two coils in the axial direction thereof such that said capacitor electrode plate does not interfere with the magnetic fluxes generated by said at least two coils, said capacitor electrode plate being disposed in the vicinity of the connection point of said at least two coils in said magnetic body such that at least a portion of said capacitor electrode plate is opposed to a portion of said at least two coils; and
   a grounding terminal integrally provided with the capacitor electrode plate, wherein said grounding terminal extends from said capacitor electrode plate to a bottom surface of the magnetic body.

2. An LC filter according to claim 1, wherein said magnetic body comprises a magnetic resin including kneaded resin and magnetic powder.

3. An LC filter according to claim 1, wherein each of said at least two coils has an outer diameter of about 10 mm and an inner diameter of about 6 mm.

4. An LC filter according to claim 1, wherein the mutual inductance M between said at least two coils is positive.

5. An LC filter according to claim 1, wherein said at least two coils are arranged such as to be coaxially disposed.

6. An LC filter according to claim 1, wherein said at least two coils are spaced from each other by a gap of about 1 mm.

7. An LC filter according to claim 6, wherein a resin disk having the same inner and outer diameters as those of said at least two coils and a thickness of about 0.25 mm is inserted into said gap and is disposed on one side of the capacitor electrode plate inserted into said gap to adjust the degree of coupling between said at least two coils.

8. An LC filter according to claim 1, wherein a main portion of the capacitor electrode plate has substantially the same planar shape as that of each of the at least two coils.

9. An LC filter according to claim 1, wherein the directions of the magnetic fluxes generated by the at least two coils are the same.

10. An LC filter comprising:
    a magnetic body;
    at least two coils including a metallic plate having a spiral shape, said at least two coils being connected in series so as to generate a mutual inductance therebetween, and said at least two coils being disposed in said magnetic body to be aligned in the axial direction thereof such that central axes of said at least two coils are substantially the same;
    a capacitor electrode plate being included within the shape of said at least two coils in the axial direction such that said capacitor electrode plate does not interfere with the magnetic fluxes generated by said at least two coils, said capacitor electrode plate being disposed between said at least two coils in said magnetic body such that at least a portion of said capacitor electrode plate is opposed to a portion of said at least two coils; and a grounding terminal integrally provided with the capacitor electrode plate, wherein said grounding terminal extends from said capacitor electrode plate to a bottom surface of the magnetic body.

11. An LC filter according to claim 10, wherein said magnetic body comprises a magnetic resin including kneaded resin and magnetic powder.

12. An LC filter according to claim 10, wherein said at least two coils each have an outer diameter of about 10 mm and an inner diameter of about 6 mm.

13. An LC filter according to claim 10, wherein the mutual inductance M between said at least two coils is positive.

14. An L1 filter according to claim 10, wherein a main portion of the capacitor electrode plate has substantially the same planar shape as that of each of the at least two coils.

15. An LC filter according to claim 10, wherein the directions of the magnetic fluxes generated by the at least two coils are the same.

16. An LC filter comprising:

a magnetic body;

at least two coils including a metallic plate having a spiral shape, said at least two coils being connected in series so as to generate a mutual inductance therebetween, and said at least two coils being disposed in said magnetic body and spaced from each other in a direction that is substantially perpendicular to the axial direction of said at least two coils so as to be adjacent to each other in the axial direction of said at least two coils;

a capacitor electrode plate included within the shape of said coils in the axial direction thereof such that said capacitor electrode plate does not interfere with the magnetic fluxes generated by said at least two coils, said capacitor electrode plate being disposed in the vicinity of the connection point of said at least two coils in said magnetic body such that at least a portion of said capacitor electrode plate is opposed to a portion of said at least coils; and a ground terminal integrally provided with the capacitor electode plate, wherein said grounding terminal extends from said capacitor electrode plate to a bottom surface of the magnetic body.

17. An LC filter according to claim 16, wherein said magnetic body comprises a magnetic resin including kneaded resin and magnetic powder.

18. An LC filter according to claim 16, wherein each of said two coils has an outer diameter of about 10 mm and an inner diameter of about 6 mm.

19. An LC filter according to claim 16, wherein the mutual inductance M between said at least two coils is positive.

20. An LC filter according to claim 16, wherein a main portion of the capacitor electrode plate has substantially the same planar shape as that of each of the at least two coils.

21. An LC filter according to claim 16, wherein the directions of the magnetic fluxes generated by the at least two coils are the same.

* * * * *